United States Patent
Faber et al.

(10) Patent No.: US 7,272,814 B2
(45) Date of Patent: Sep. 18, 2007

(54) RECONFIGURING A RAM TO A ROM USING LAYERS OF METALLIZATION

(75) Inventors: Allen Faber, Vancouver, WA (US); Ghasi Agrawal, Sunnyvale, CA (US)

(73) Assignee: LSI Corporation, Milpitas, CA (US)

(*) Notice: Subject to any disclaimer, the term of this patent is extended or adjusted under 35 U.S.C. 154(b) by 424 days.

(21) Appl. No.: 10/946,274

(22) Filed: Sep. 20, 2004

(65) Prior Publication Data
US 2006/0064664 A1    Mar. 23, 2006

(51) Int. Cl.
*G06F 17/50* (2006.01)

(52) U.S. Cl. .............. 716/16; 716/14; 716/17; 716/18

(58) Field of Classification Search ........... 716/16, 716/14, 17, 18
See application file for complete search history.

(56) References Cited

U.S. PATENT DOCUMENTS

| | | | | |
|---|---|---|---|---|
| 5,378,906 A | * | 1/1995 | Lee .......................... | 257/296 |
| 5,995,409 A | * | 11/1999 | Holland ...................... | 365/149 |
| 6,304,950 B1 | * | 10/2001 | Inoue et al. ................ | 711/170 |
| 2002/0088996 A1 | * | 7/2002 | Yoo et al. .................. | 257/200 |

* cited by examiner

*Primary Examiner*—Sun James Lin
(74) *Attorney, Agent, or Firm*—Strategic Patent Group, P.C.

(57) ABSTRACT

The present invention is a method for reconfiguring a RAM into a ROM. First a RAM is fabricated on a platform ASIC in which the memory is patterned with first and second metal layers that intersect over each cell, wherein the first metal layer comprises local core cell nodes and the second metal layer comprises power/ground. The RAM is also fabricated with metal junction points on the first metal layer in at least a portion of the intersections. Thereafter, the RAM is reconfigured to a ROM by forming vias between the intersections of the first and second metal layers over the junction points to connect the first metal layer to the second metal layer.

16 Claims, 11 Drawing Sheets

RECONFIGURING A RAM TO A ROM USING LAYERS OF METALLIZATION

FIELD OF THE INVENTION

The present invention relates generally to application specific integrated circuit (ASIC) system-on-a-chip design, and more particularly to a method and apparatus for reconfiguring a RAM on an ASIC as a ROM using upper layers of metallization.

BACKGROUND OF THE INVENTION

The assignee of the present application has developed RapidChip™ technology that lets designers quickly and affordably create high-performance, complex, customized ICs. RapidChip is a chip building technique, which dramatically lowers cost, risk and time-to-market. Each RapidChip™ slice is a pre-manufactured, pre-verified chip at the density and power of an ASIC in which all silicon-based layers and some metal layers have been built, leaving the top metal layers to be completed with the customer's unique intellectual property. The customer selects a desired slice that best accommodates their application, and then creates a proprietary design using the final metal layers of the chip.

The fundamental technology used in the RapidChip technology is the metal customization of a partially manufactured semiconductor device, e.g., an ASIC, in which all silicon layers of a slice have been fabricated. Rapidchip customization layers are limited to VIA1 (that layer which provides connection between metal 1 and metal 2) and above, which include metal layers M2-M8, the lowest programmable level being layer VIA1. Each slice incorporates diffused memory blocks, PLLs, IP blocks from a CoreWare® library, configurable transistor fabric, and an I/O ring made up of configurable and dedicated I/Os for specific requirements. For example, most slices made are fabricated with several instances of medium density static RAM (SRAM), but it has been observed that a ROM is utilized in less than 10% of all custom RapidChip designs. This makes it inefficient for a chip manufacturer to employ an actual ROM solution in a platform ASIC, such as RapidChip. However, the chip manufacturer must still offer a ROM solution to satisfy the demands of certain customers, even if only for that 10%.

Accordingly, there is a need for a more efficient method for providing memory on a platform ASIC that will accommodate custom designs that require RAM and/or ROM. The present invention address, such a need.

SUMMARY OF THE INVENTION

The present invention provides a method and system for reconfiguring a RAM into a ROM. First, a RAM is fabricated on a platform ASIC in which the silicon layers of a memory are patterned along with a first metal layer. The RAM is also fabricated with appropriate metal junction points between the first metal layer and a second metal layer, preferably between M1-M2, in at least a portion of the potential intersections. Thereafter, the RAM is reconfigured to a ROM by forming vias between the intersections of the first and second metal layers over the junction points to connect the first metal layer to the second metal layer.

According to the method and system disclosed herein, the reconfiguration of the ROM to a RAM requires no address changes, no I/O changes, and no control changes, only modification to core memory cells. The present invention utilizes the VIA1 layer of the platform ASIC to reconfigure an existing RAM, and also provides metal overlaps on the first metal layer adjacent to via landing sites to meet design rules. This method allows the reconfiguration of a single RAM cell into a single ROM cell using either a single or dual-port RAM cell, and avoids the requirement of adding a predefined ROM to the platform ASIC, saving die area. Another advantage is that programming the ROM cell is made simple, using only a single via to produce one of two possible states. For the ROM resulting from the dual-port SRAM conversion, the resulting changes to the platform ASIC are so benign that the changes will require no additional analysis or simulation. The ROM may also be configured to be a dual-port ROM.

DETAILED DESCRIPTION OF THE INVENTION

The present invention relates to ASIC design methodology. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method for using the upper layers of metallization of a prediffused RAM in a platform ASIC, such as RapidChip, to reconfigure the RAM as a ROM during customization at the VIA1 level. According to the present invention, a VIA1 layer is used to reconfigure the RAM on the platform ASIC; and metal overlaps, referred to as junction points, are provided adjacent to via landing sites to meet design rules.

According to the present invention, the reconfiguration of the ROM to a RAM requires no address changes, no I/O changes, and no control changes, only modification to core memory cells, which can be done by modifying the core cell layout, with essentially zero impact to the extracted netlist. The memory on the platform ASIC may be fabricated with either single-port or dual-port SRAM. However, in a preferred embodiment of the present invention, dual-port SRAM is used due to the presence of extra metal and larger size, which makes the cells less dense. In the embodiment where a dual-port SRAM array is used, single SRAM cells are individually reconfigured into corresponding single ROM cells. Although the preferred embodiment will be described for use with the RapidChip ASIC platform, the present invention may be applied to other platforms and uses.

Figure 1:
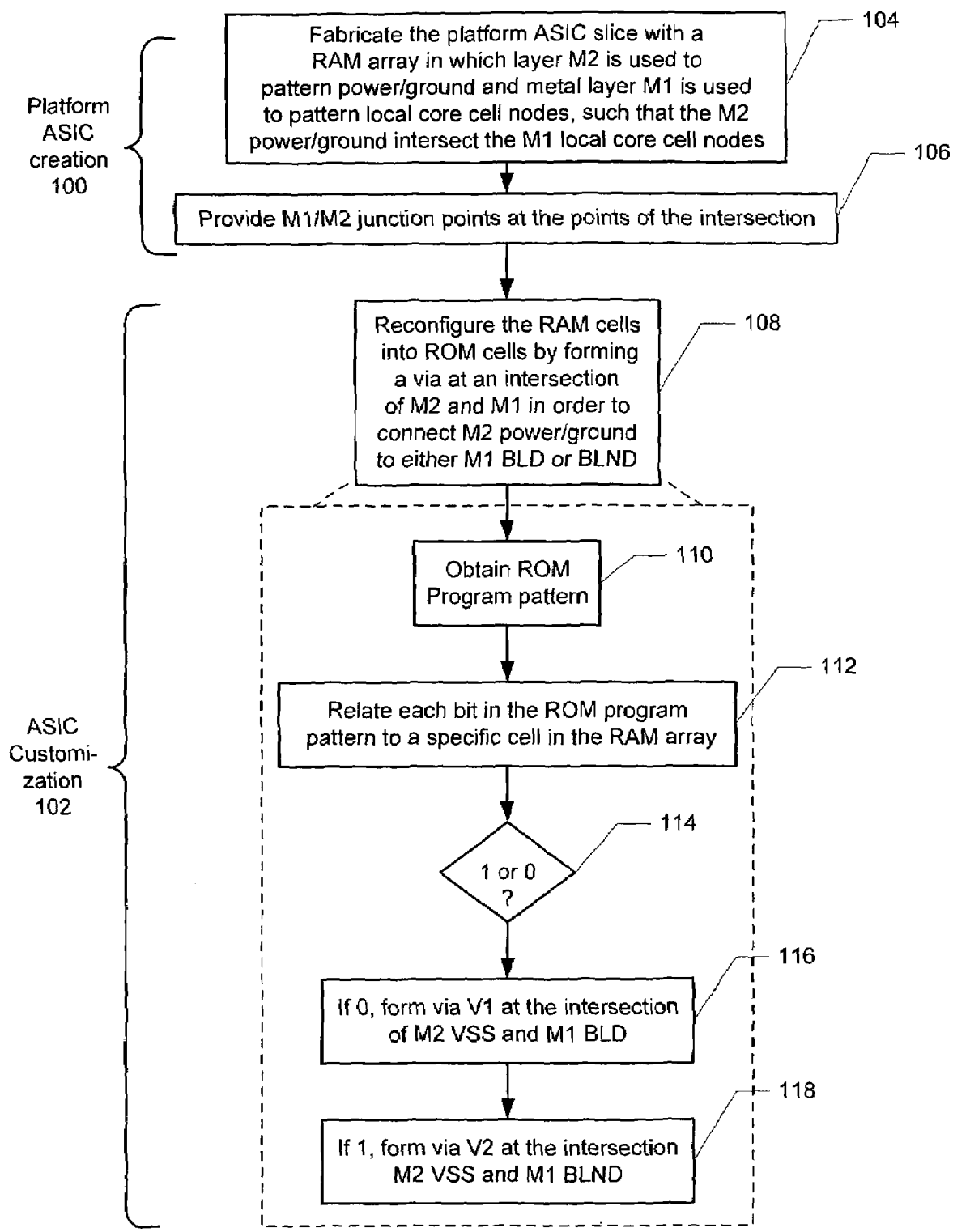
FIG. 1 is a flow diagram illustrating a process for reconfiguring a platform ASIC RAM into a ROM using upper layers of metallization.

FIG. 1 is a flow diagram illustrating a process for reconfiguring a platform ASIC RAM into a ROM using upper layers of metallization in accordance with a preferred embodiment of the present invention. The process includes two steps; platform ASIC creation 100, which is performed by the IC manufacturer, and ASIC customization 102, in which a customer selects components of the ASIC for use in a custom design and uses upper metallization layers to interconnect the components as desired.

According to the present invention, the platform ASIC is designed and fabricated so that the underlying structure of the RAM will support subsequent customization. In a preferred embodiment, this is accomplished by fabricating the platform ASIC slice with a diffused random-access memory (RAM) in which the metal layer 2 (hereinafter M2) is used to pattern power/ground, and metal layer 1 (M1) is used to pattern local core cell nodes, such that the M2 power/ground intersect the M1 local core cell nodes (step 104). In addition, potential M1/M2 junction points are provided at the points of the intersection (step 106), such that design rule checking (DRC) for vias are met for both the "0" and "1" via options, explained further below.

Figure 2:
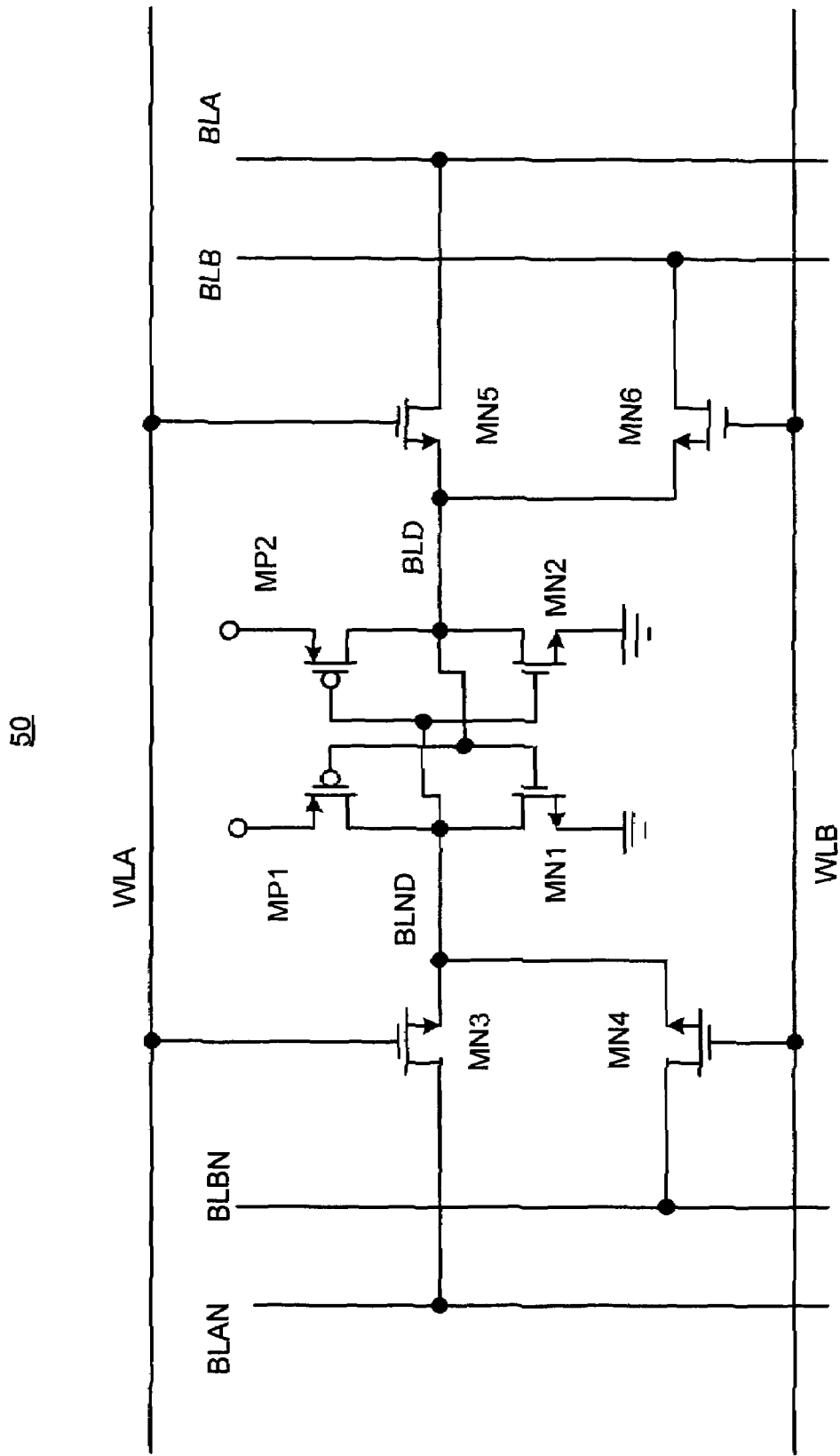
FIG. 2 is a schematic diagram illustrating a conventional dual-port SRAM cell, which may be used to fabricate the diffused RAM in the platform ASIC.

FIG. 2 is a schematic diagram illustrating a conventional dual-port SRAM cell 50, which may be used to fabricate the diffused RAM in the platform ASIC. As shown, the dual-port SRAM cell 50 includes two word lines, A (WLA) and B (WLB); and bitlines, A (BLA), B (BLB), A Not (BLAN), and B Not (BLBN). BLD and BLND are local core cell nodes.

Figure 3:
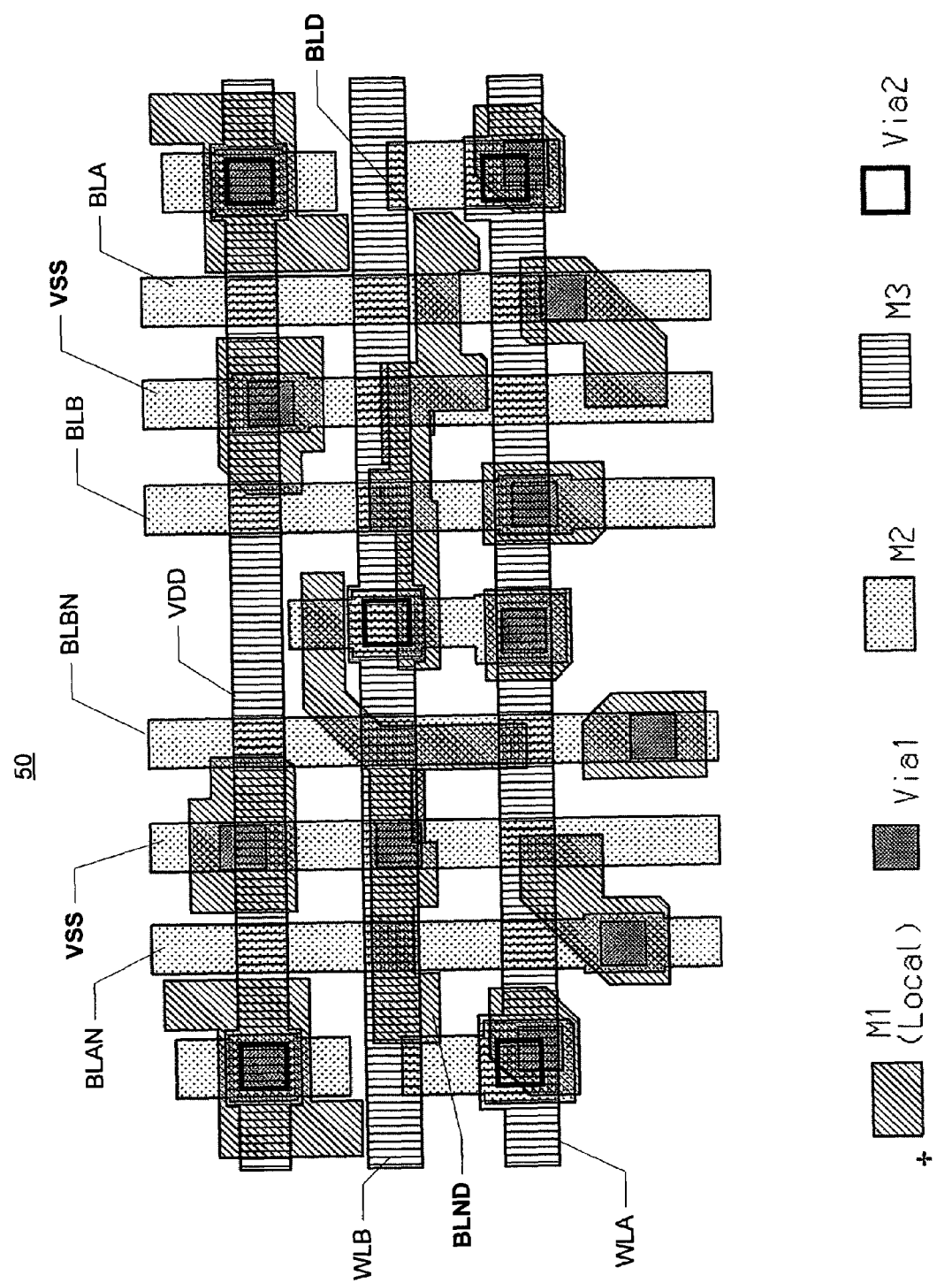
FIG. 3 is an IC layout diagram illustrating a representation of the dual-port SRAM cell fabricated using upper metallization layers M1, M2 and M3 of the platform ASIC.

FIG. 3 is a diagram illustrating a representation of the dual-port SRAM cell 50 fabricated using upper metallization layers M1, M2 and M3 of the platform ASIC, where like components from FIG. 2 have like reference numerals. As shown in FIG. 3, M1 is used to pattern local core cell nodes BLD and BLND; vertical M2 is used to pattern BLA, BLB, BLAN, BLBN; and horizontal M3 is used to pattern WLA, WLB. In a preferred embodiment, array power is patterned using horizontal M3 VDD, and vertical M2 VSS.

Referring again to FIG. 1, after the platform ASIC has been fabricated, a customer may utilize the platform ASIC for a custom design. The process assumes that the custom design requires the use of a ROM, which may be part, or all, of the supplied RAM. Of course, if the custom design only requires use of a RAM, then the design would incorporate the RAM provided on the platform ASIC and no changes to the RAM would be required. According to the present invention, in order to reconfigure all or a portion of the RAM array to a ROM array, a via is formed on layer VIA1 at an intersection of M2 and M1 in order to connect M2 power/ground to either M1 BLD or BLND (108). As used herein, the term power/ground may correspond to VDD and VSS, respectively. In an alternative embodiment, rather than power/ground, logic one and logic zero may also be used.

More specifically, this step includes obtaining the ROM program pattern (step 110), and relating each bit in the ROM program pattern to a specific cell in the RAM array (step 112). For each cell in the RAM array, it is determined if the corresponding bit is a binary 1 or 0 (step 114). For each cell that has a corresponding 0 bit, the cell is programmed to read out a zero by forming a via, V1, on the layer VIA1 at the intersection of M2 VSS and M1 BLD to connect VSS to BLD (step 116). For each cell that has a corresponding 1 bit, the cell is programmed to read out a one by forming a via, V2, on the layer VIA1 at the intersection of M2 VSS and M1 BLND to connect VSS to BLND (step 118). In an alternative dual-port SRAM embodiment, the via may be formed at the intersection of M2 VDD and BLD or BLND, rather than M2 VSS.

Figure 4A:
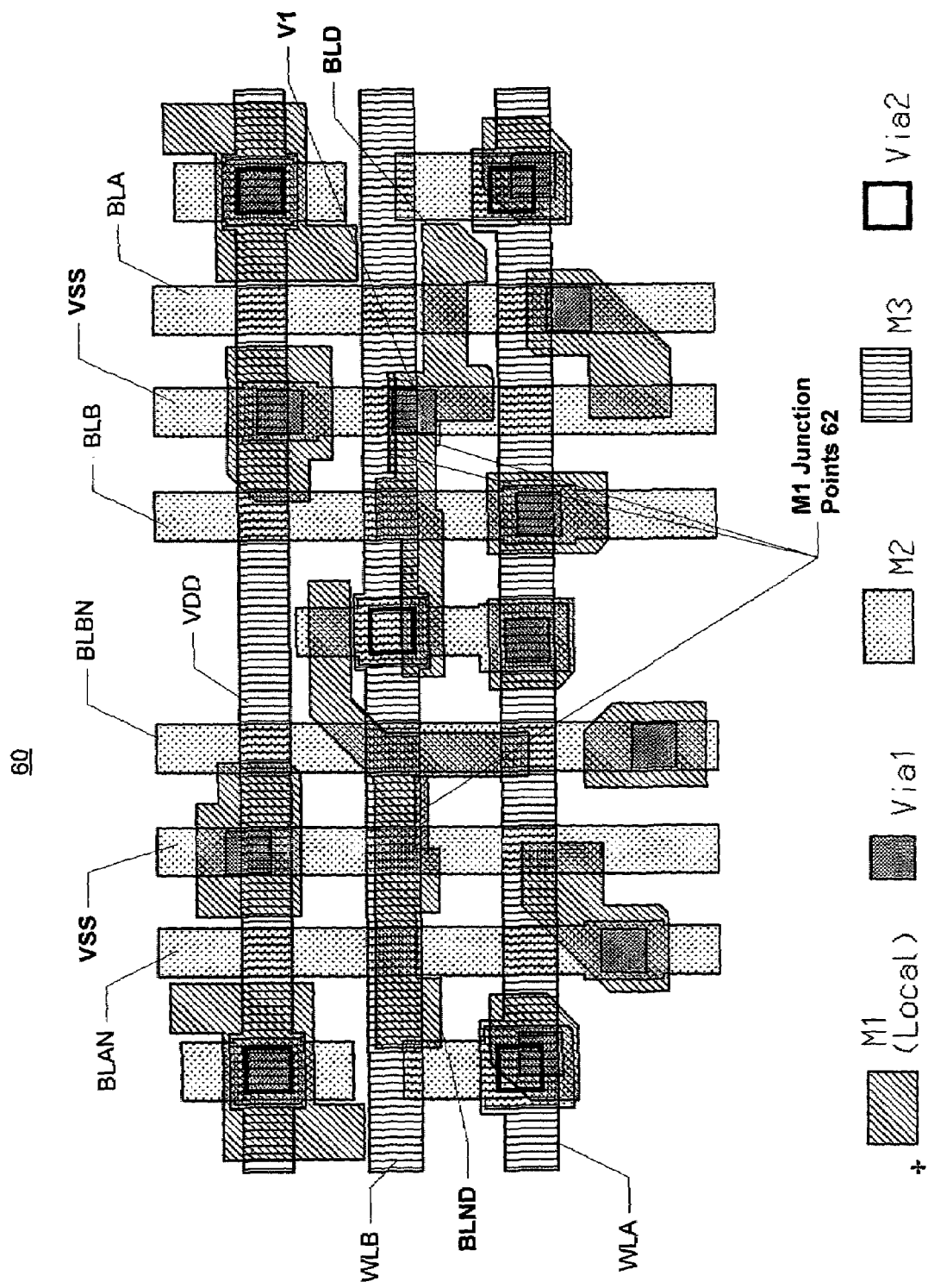
FIGS. 4A and 4B are IC layout diagrams illustrating a representation of a dual-port ROM cell reconfigured from the dual-port SRAM cell using either V1 or V2 vias on layer VIA1, respectively.
Figure 4B:
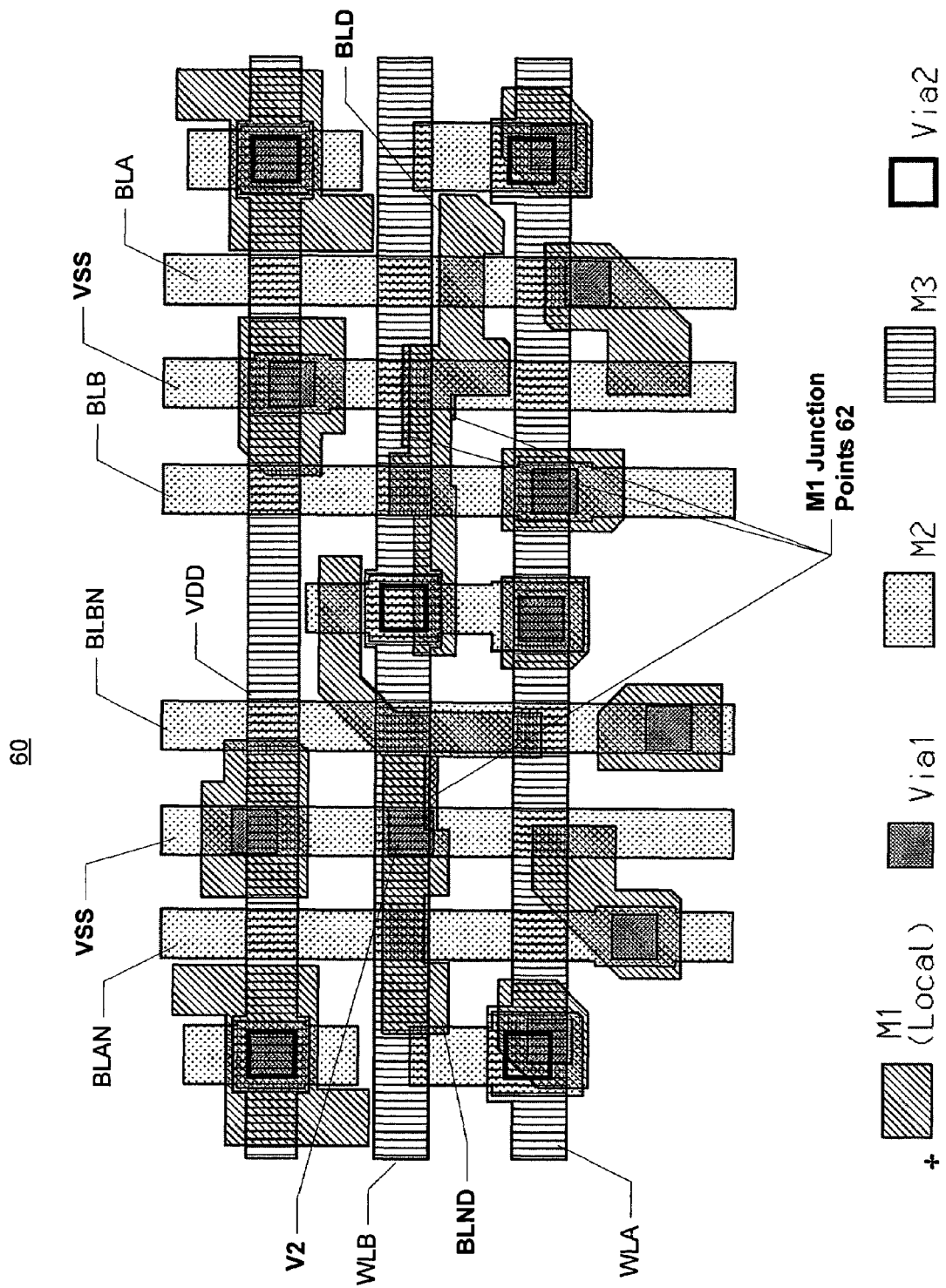

FIGS. 4A and 4B are simplified diagrams illustrating a representation of a dual-port ROM 60 reconfigured from the dual-port SRAM 50, where like components from FIGS. 2 and 3 have like reference numerals. As shown in FIGS. 4A and 4B, respectively, the dual-port ROM 60 is created and programmed by the formation of either V1 or V2 on the VIA1 layer. According to one aspect of the present invention, potential M1 junction points 62 that act as a landing site for via placement the V1 or V2 at the points of the intersection between M2 VSS and BLD or BLND, are reconfigured during creation of the platform ASIC to meet standard design rules for M1 overlap of vias by the addition of M1, as shown. Without the slight layout modifications needed to allow reconfiguring the RAM into a ROM, original junction points at the M1/M2 intersections may be inadequate to support via placements. This should be a consideration during the SRAM core cell design phase.

Thus, according to the present invention, the conversion from the SRAM 50 into the ROM 60 is promoted by only a slight M1 change during SRAM fabrication to support the junction points 62, but does not affect operation of the SRAM. Then during customization, either V1 on the VIA1 layer is placed on the BLD node to program the cell with a zero, as shown in FIG. 4A, or V2 on the VIA1 layer is placed on the BLND node to program the cell with a 1, as shown in FIG. 4B.

Figure 5:
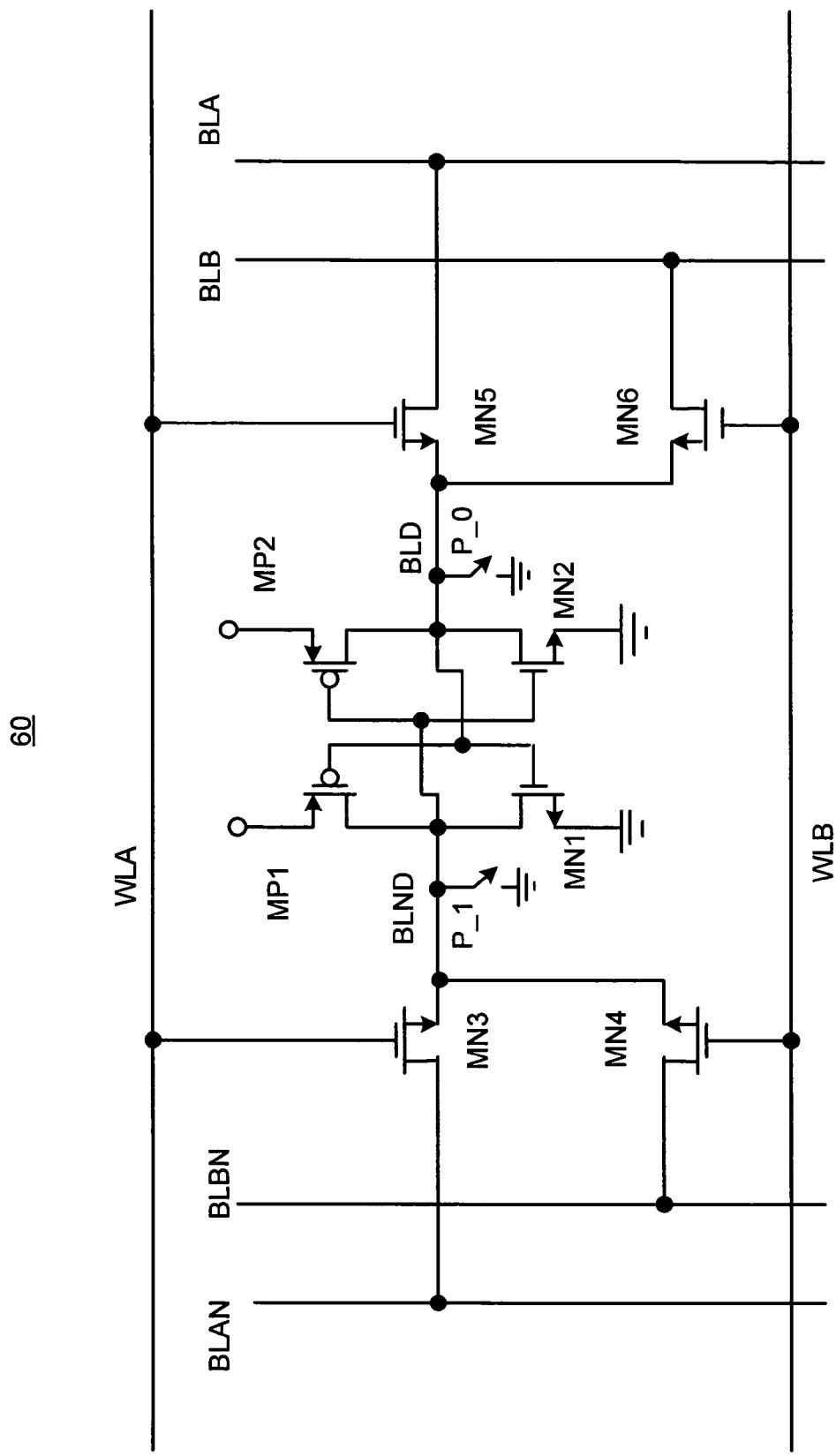
FIG. 5 is a schematic diagram of the dual-port ROM. Programming is accomplished by closing either switch P_0 or P_1.

FIG. 5 is a schematic diagram of the dual-port ROM 60. The schematic of the dual-port ROM 60 is similar to the dual-port SRAM cell 50 shown in FIG. 2, except the dual-port ROM 60 includes switches P_0 and P_1 corresponding to V1 and V2. These switches actually represent placement (switch closed) or non-placement (switch open) of a via at the intersections of BLD and VSS (P_0), or BLND and VSS (P_1). If V1 is present, then P_0 is closed, and BLD goes to ground. If V2 is present, then P_1 is closed, and BLND goes to ground. Note that the resulting ROM 60 can read from either (or both) data ports. According to the present invention, the dual-port ROM 60 can be configured by forming vias to connect any of the following: VDD or VSS to BLD, VDD or VSS to BLND, BLD to VSS and BLND to VDD, or BLD to VDD and BLND to VSS. The only limitation is that both sufficient metal and sufficient space to place vias is needed in the RAM that is to be converted. Since most core cells are designed compactly, the preferred embodiment utilizes dual-port SRAM cells since the VSS M2 intersection with M1 local core cell nodes is convenient.

However, the method of reconfiguring a single dual-port RAM cell to make a single ROM cell in accordance with the present invention provides numerous advantages. First, reconfiguring an existing ROM into a RAM avoids the requirement of adding a predefined ROM to the platform ASIC, saving die area for the approximately 90% of customers who do not require ROM. Second, programming the ROM 60 is made simple, using only a single via to produce one of two possible states. For the ROM 60 resulting from the dual-port SRAM conversion, the resulting changes to the platform ASIC are so benign that the changes will require no additional analysis or simulation, so the ROM specs will be a subset of the RAM specs (no write). Third, the ROM 60 resulting from the dual-port SRAM conversion may be configured to a dual-port ROM, if that is any advantage to the custom design.

In a second embodiment, the platform ASIC is provided with an array of single-port SRAM cells (rather than a dual-port SRAM cells), and the single-port SRAM cells are converted into ROM cells using upper layers of the platform ASIC. One method would be to use a platform ASIC having a diffused memory based on a six-transistor memory cell (6T).

Figure 6:
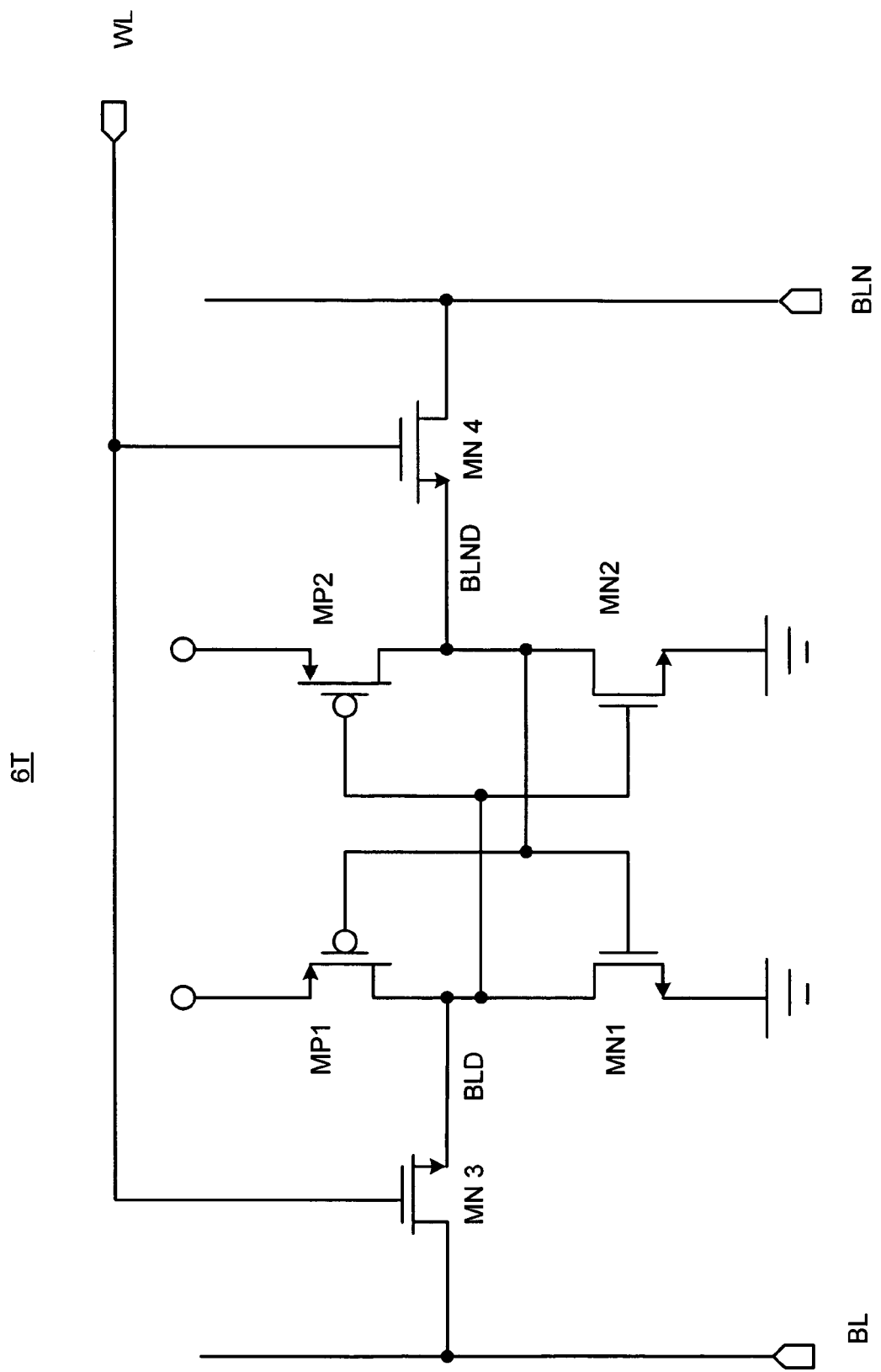
FIG. 6 is a schematic diagram illustrating a conventional single-port SRAM 6T cell.

FIG. 6 is a schematic diagram illustrating a conventional 6T cell. 6T memory is built around a latching memory cell that contains six transistors. Because of the latching action of the circuit, 6T memory is referred to as static RAM (SRAM), which implies that the memory cell can hold its stored value as long as power is present. Besides the six transistors MN and MP, the 6T cell includes a wordline WL, and bitlines BL, BLN, and local core cell nodes BLD and BLND. Typically, the 6T cell is not considered suitable for simple conversion since the metal resources are normally not available. However, it can be suitable when certain core cells are used which are less dense, such as those provided with extra metal resources to allow for a block architecture.

Figure 7:
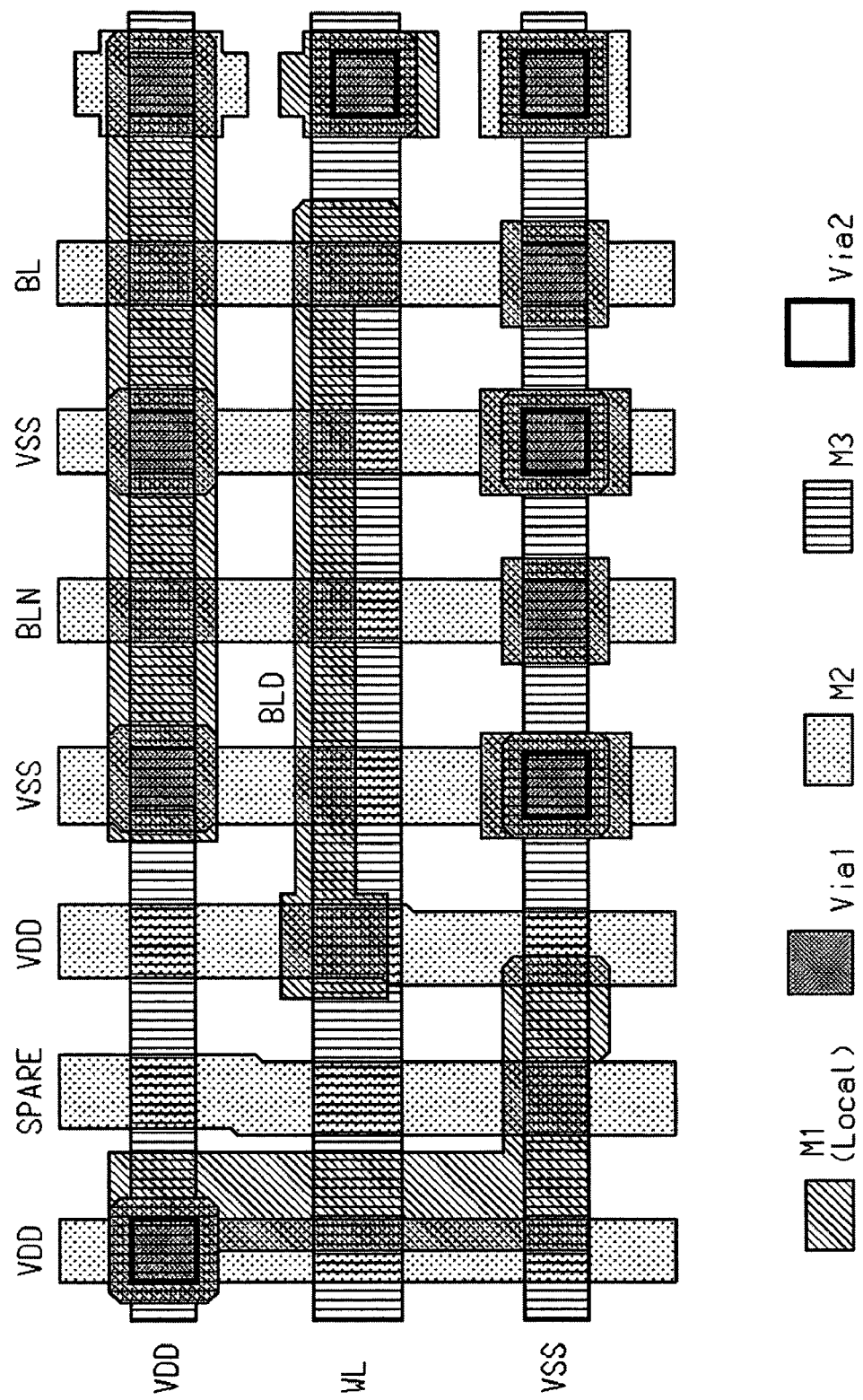
FIG. 7 is an IC layout diagram illustrating a representation of the single-port SRAM 6T cell fabricated using upper metallization layers M1, M2, and M3 of the platform ASIC.

FIG. 7 is a diagram illustrating a representation of a single-port SRAM cell fabricated using upper metallization layers M1, M2, and M3 of the platform ASIC, where like components from FIG. 6 have like reference numerals. As shown in FIG. 7, M1 is used to pattern local core cell node BLD; vertical M2 is used to pattern BLA, BLAN; and horizontal M3 is used to pattern WLA. In a preferred embodiment, array power is patterned using horizontal M3 VDD/VSS, and vertical M2 VDD/VSS.

Figure 8A:
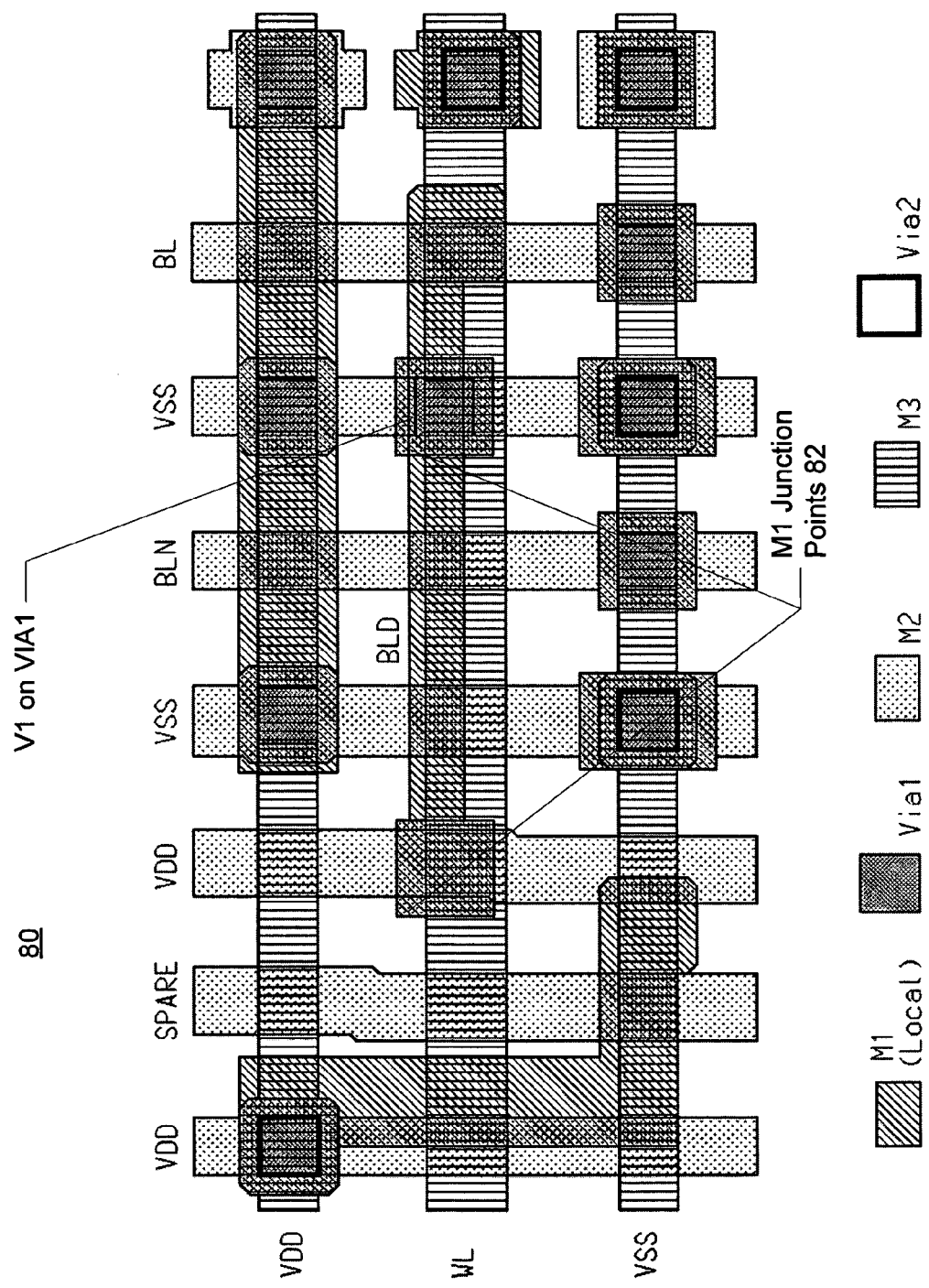
FIGS. 8A and 8B are IC layout diagrams illustrating a representation of a single-port ROM cell reconfigured from the single-port SRAM 6T cell.
Figure 8B:
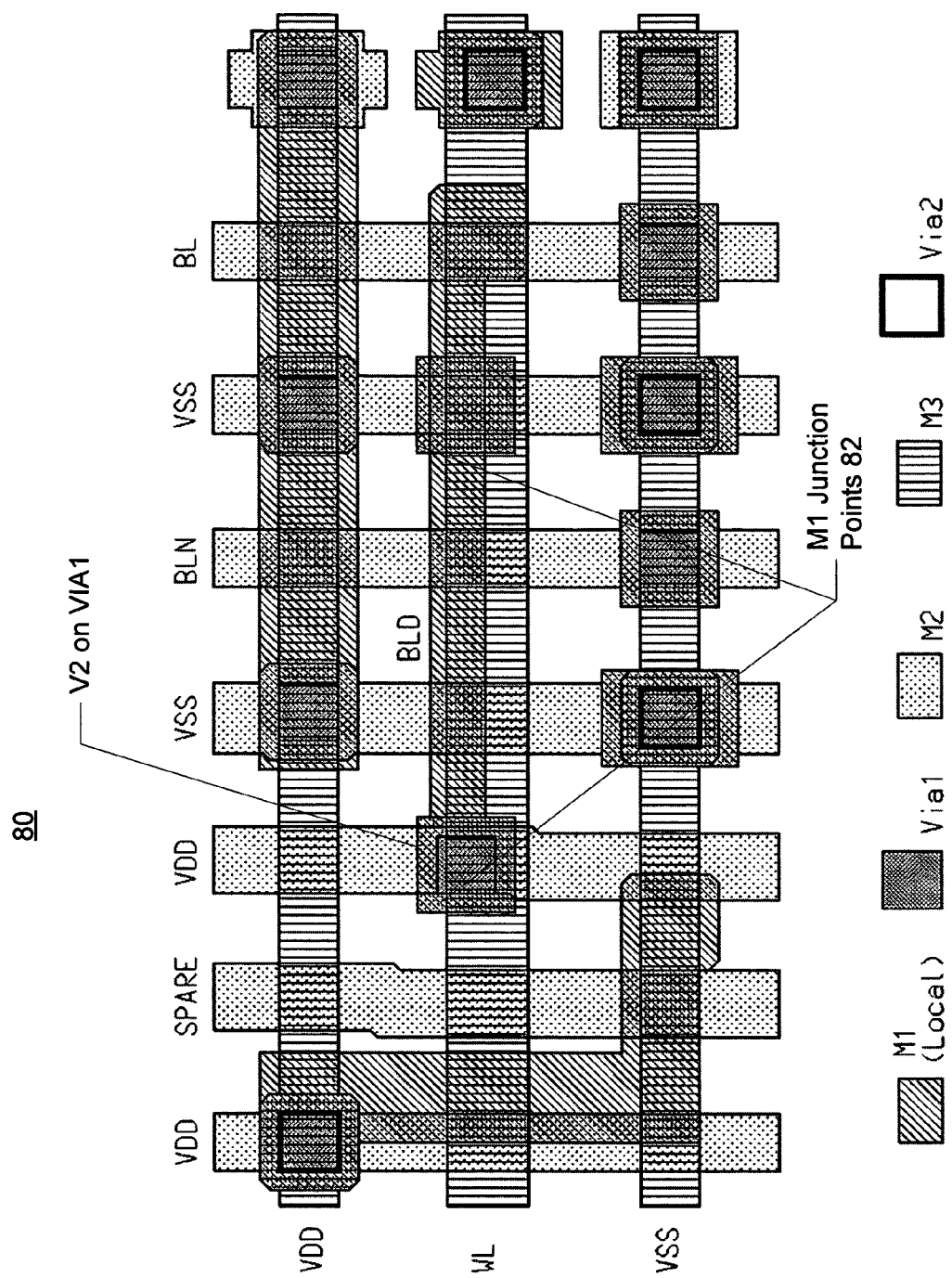

FIGS. 8A and 8B are diagrams illustrating a representation of a single-port ROM 80 reconfigured from the single-port SRAM 6T. The process is similar to the dual-port conversion. The single-port SRAM 6T is fabricated such that M2 VSS/VDD intersects with M1 BLD. Proper M1 junction points 82 are provided to act as landing points for the VIA1 at the points of the intersection between M2 VSS/VDD and BLD to meet standard design rules for M1 overlap of vias. In this case, the VIA1 requires additional metal to provide Via1 overlap on both M1 and M2. Again, two via sites are provided; one is used for programming a zero and the other for programming a 1. The single-port ROM 60 is created and programmed by the formation of either V1 on the VIA1 layer over one of the intersections to connect BLD to VSS, as shown in FIG. 8A, or the formation of V2 on the VIA1 layer over the intersection to connect BLD to VDD, as shown in FIG. 8B.

Figure 9:
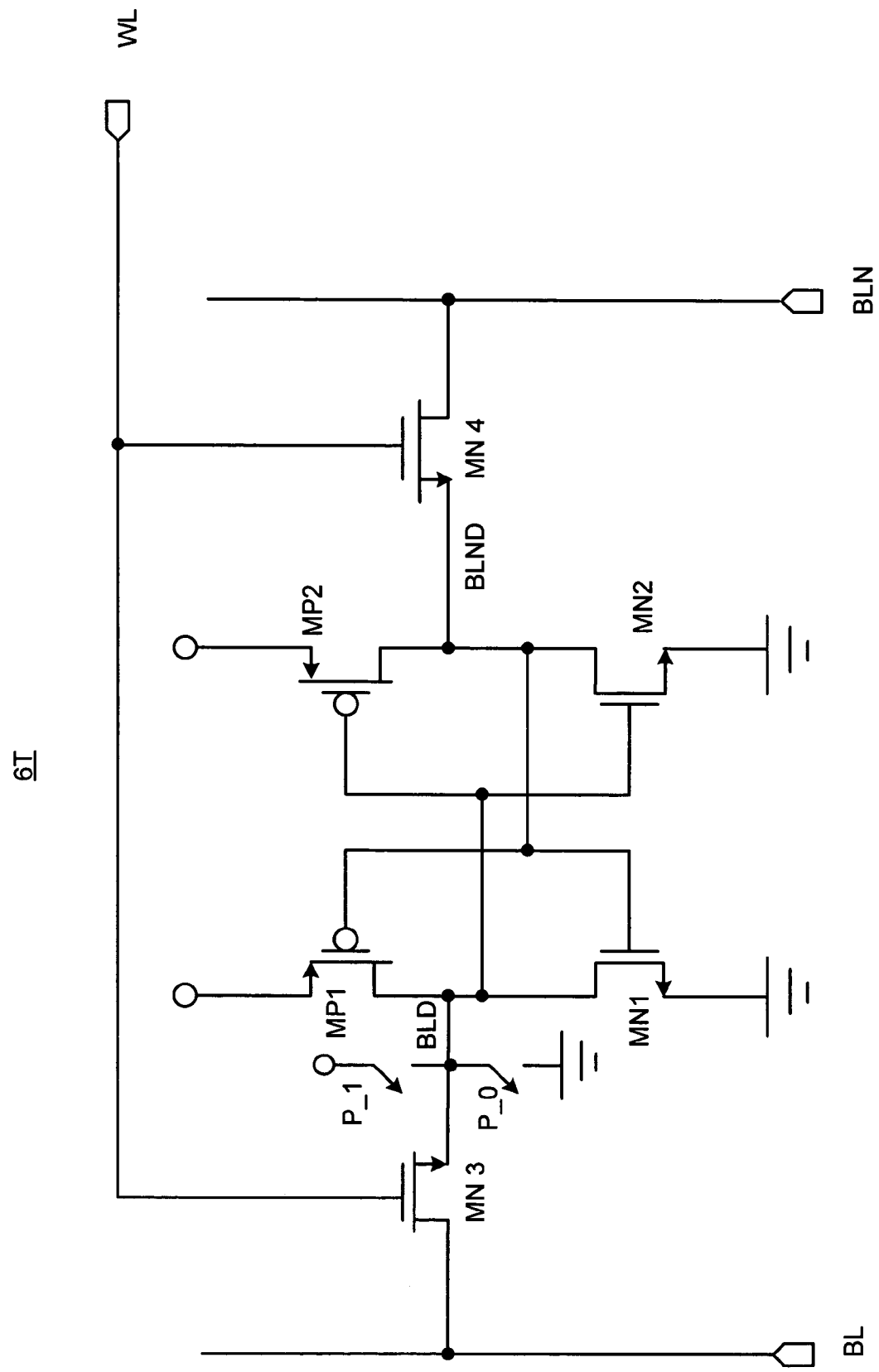
FIG. 9 is a schematic circuit diagram of the single-port ROM cell wherein programming is accomplished by closing either switch P_0 or P_1.

FIG. 9 is a schematic circuit diagram of the single-port ROM 80. The schematic of the single-port ROM 80 is similar to the single-port 6T SRAM cell shown in FIG. 6, except the single-port ROM 80 includes switches P_0 and P_1 corresponding to the placement of V1 or V2 to provide switch P_0 or P_1, respectively.

In summary, the method for reconfiguring a single-port ROM to a single-port RAM in a platform ASIC requires only a slight M1 and M2 change in the base layers, which meets standard rules for M1 overlap of VIA1, the rules for M2 overlap of VIA1, and the standard M1 and M2 spacing rules. Programming the RAM with a zero requires a single via to VSS on BLD node, and programming the RAM with a one requires a single via to VDD on the BLD node. In addition, no core cell analysis or HSPICE modeling changes are required, due to minimal core cell changes, but the cell would probably need to be re-extracted for bitline capacitance. No addressing changes, I/O changes, or control changes are required.

A method and apparatus for reconfiguring a RAM into a ROM using upper layers of metallization of a platform ASIC has been disclosed. The present invention has been described in accordance with the embodiments shown, and one of ordinary skill in the art will readily recognize that there could be variations to the embodiments, and any variations would be within the spirit and scope of the present invention. For example, rather than using power/ground, the present invention may be implemented using logic 1 and logic 0. Accordingly, many modifications may be made by one of ordinary skill in the art without departing from the spirit and scope of the appended claims.

We claim:

1. A method for reconfiguring a RAM to a ROM, comprising:
    fabricating a RAM during creation of a platform ASIC, the RAM having a plurality of cells patterned with a first metal layer and a second metal layers that intersect over each cell, wherein the first metal layer comprises local core cell nodes and the second metal layer comprises power/ground, the RAM further including metal junction points on the first metal layer in at least a portion of the intersections of the first metal layer and the second metal layer; and
    reconfiguring the RAM to a ROM, during customization of the platform ASIC when a custom design requires use of a ROM in at least a portion of the RAM, by forming vias between the intersections of the first metal layer and the second metal layers over the junction points to connect the first metal layer to the second metal layer.

2. The method of claim 1 further comprising, forming the vias to connect at least one of the following;
    power to a first local core cell node,
    power to a second local core cell node,
    ground to the first local core cell node,
    ground to the second local core cell node,
    the first local core cell node to power, and the second local core cell node to ground, and
    the second local core cell node to power, and the first local core cell node to ground.

3. The method of claim 2 further comprising: providing the RAM as a single-port SRAM.

4. The method of claim 3 wherein the single-port SRAM comprises a 6T cell.

5. A method for reconfiguring a RAM to a ROM, comprising:
    fabricating a RAM during creation of a platform ASIC, the RAM having a plurality of cells patterned with a first metal layer and a second metal layer that intersect over each cell, wherein the first metal layer comprises local core cell nodes and the second metal layer comprises power/ground, the RAM further including metal junction points on the first metal layer in at least a portion of the intersections of the first metal layer and the second metal layer;

reconfiguring the RAM to a ROM, during customization of the platform ASIC when a custom design requires use of a ROM in at least a portion of the RAM, by forming vias between the intersections of the first metal layer and the second metal layer over the metal junction points to connect the first metal layer to the second metal layer; and forming the vias to connect at least one of the following: power to a first local core cell node, power to a second local core cell node, ground to the first local core cell node, ground to the second local core cell node, the first local core cell node to power and the second local core cell node to ground, and the second local core cell node to power and the first local core cell node to ground, wherein the ROM includes internal core cell nodes BLD and BLND and can be customized using a VIA1 layer, the RAM to ROM reconfiguration process further comprising:

obtaining a ROM program pattern, relating each bit in the ROM program pattern to a specific cell in the RAM, for each cell comprising the RAM, determining if the corresponding bit is a binary 1 or 0, for each cell that has a corresponding 0 bit, programming the each cell to read out a zero by forming a via, V1, on the VIA1 layer at an intersection of M2 VSS and M1 BLD to connect VSS to BLD, and for each cell that has a corresponding 1 bit, programming the each cell to read out a one by forming a via, V2, on the VIA1 layer at an intersections of M2 VSS and M1 BLND to connect VSS to BLND.

6. The method of claim 5 further comprising: providing the RAM to be converted as a dual-port SRAM.

7. A method for reconfiguring a RAM to a ROM, comprising:

fabricating a platform ASIC slice with a diffused RAM array using M1 for local core cell nodes, BLD and BLND, and using M2 for power/ground, such that M2 power/ground and M1 local core cell nodes intersect in at least a portion of cells comprising the RAM;

providing M1/M2 junction points at the intersections of the M2 power/ground and the M1 local core cell nodes; and reconfiguring RAM cells into ROM cells during customization of the platform ASIC slice when a custom design requires use of a ROM in at least a portion of the RAM, using upper metallization layer VIA1 by forming vias at an intersection of M2 and M1 in order to connect M2 power/ground to either M1 BLD or BLND.

8. The method of claim 7 further comprising: providing the RAM to be converted as a single-port SRAM.

9. The method of claim 8 wherein the single-port SRAM comprises a 6T cell.

10. A method for reconfiguring a RAM to a ROM, comprising:

fabricating a platform ASIC slice with a diffused RAM array using M1 for local core cell nodes, BLD and BLND, and using M2 for power/ground, such that M2 power/ground and M1 local core cell nodes intersect in at least a portion of cells comprising the RAM;

providing M1/M2 junction points at the intersections of the M2 power/ground and the M1 local core cell nodes; and reconfiguring RAM cells into ROM cells using upper metallization layer VIA1 by forming vias at an intersection of M2 and M1 in order to connect M2 power/ground to either M1 BLD or BLND, wherein the reconfiguring the RAM cells into ROM cells further comprises:

obtaining a ROM program pattern, relating each bit in the ROM program pattern to a specific cell in the RAM, for each cell comprising the RAM, determining if the corresponding bit is a binary 1 or 0, for each cell that has a corresponding 0 bit, programming the each cell to read out a zero by forming a via at an intersection of M2 VSS and M1 BLD to connect VSS to BLD, and for each cell that has a corresponding 1 bit, programming the each cell to read out a one by forming a via at an intersection of M2 VSS and M1 BLND to connect VSS to BLND.

11. The method of claim 10 further comprising converting a RAM to produce a ROM which can be read from either or both ports.

12. The method of claim 10 further comprising: providing the RAM to be converted as a dual-port SRAM.

13. An ASIC originally fabricated with a RAM in which at least a first portion of cells comprising the RAM has been reconfigured into a ROM during customization of the ASIC when a custom design requires use of a ROM in at least a portion of the RAM, using upper layers of metallization, comprising:

a first metal layer forming first and second nodes in the first portion of cells;

a second metal layer forming power/ground, such that the power/ground intersect the first and second nodes;

junction points patterned at points of intersection, such that DRC for vias are met; and a via between the first and second metal layers in order to connect the power/ground to either the first or second nodes in each of the first portion of cells.

14. An ASIC originally fabricated with a RAM in which at least a first portion of cells comprising the RAM has been reconfigured into a ROM using upper layers of metallization, comprising:

a first metal layer forming first and second nodes in the first portion of cells;

a second metal layer forming power/ground, such that the power/ground intersect the first and second nodes;

junction points patterned at points of intersection, such that DRC for vias are met; and a via between the first and second metal layers in order to connect the power/ground to either the first or second nodes in each of the first portion of cells, wherein the via is formed during ASIC customization by:

obtaining a ROM program pattern for the ROM, relating each bit in the ROM program pattern to a specific cell in RAM array, for each of the first portion of cells, determining if a corresponding bit is a binary 1 or 0, for each cell that has a corresponding 0 bit, programming the each cell to read out a zero by forming a via, V1, at an intersection of VSS on the second metal layer and the first node on the first metal layer to connect VSS to the first node, and for each cell that has a corresponding 1 bit, programming the each cell to read out a one by forming a via, V2, at an intersection of VSS on the second metal layer and the second node on the first metal layer to connect VSS to the second node.

15. A method for using the upper layers of metallization to reconfigure a RAM to a ROM during customization of an ASIC, comprising:
  fabricating an ASIC slice with a RAM by,
    using a first metal layer to pattern first and second nodes in a first portion of cells comprising the RAM, and
    using a second metal layer to pattern power/ground, such that the power/ground intersect the first and second nodes, and providing junction points at points of intersection, such that DRC for vias are met; and
  after fabrication, utilizing the ASIC slice in a custom design that requires the first portion of cells comprising the RAM to be reconfigured into a ROM, wherein the RAM to ROM reconfiguration is performed by,
    forming a via between the first and second metal layers in order to connect power/ground to either the first or second nodes in each of the first portion of cells.

16. A method for using the upper layers of metallization to reconfigure a RAM to a ROM during customization of an ASIC, comprising:
  fabricating an ASIC slice with a RAM by,
    using a first metal layer to pattern first and second nodes in a first portion of cells comprising the RAM, and
    using a second metal layer to pattern power/ground, such that the power/ground intersect the first and second nodes, and providing junction points at points of intersection, such that DRC for vias are met; and
  after fabrication, utilizing the ASIC slice in a custom design that requires the first portion of cells comprising the RAM to be reconfigured into a ROM, wherein the RAM to ROM reconfiguration is performed by,
    forming a via between the first and second metal layers in order to connect power/ground to either the first or second nodes in each of the first portion of cells, wherein forming the via further includes:
    obtaining a ROM program pattern for the ROM,
    relating each bit in the ROM program pattern to a specific cell in the RAM,
    for each of the first portion of cells, determining if a corresponding bit is a binary 1 or 0,
    for each cell that has a corresponding 0 bit, programming the each cell to read out a zero by forming a via, V1, at an intersection of VSS on the second metal layer and the first node on the first metal layer to connect VSS to the first node, and
    for each cell that has a corresponding 1 bit, programming the each cell to read out a one by forming a via, V2, at an intersection of VSS on the second metal layer and the second node on the first metal layer to connect VSS to the second node.

* * * * *